US010224097B2

(12) United States Patent
Kumar et al.

(10) Patent No.: US 10,224,097 B2
(45) Date of Patent: Mar. 5, 2019

(54) METHOD AND APPARATUS FOR ENHANCING READ STABILITY OF A STATIC RANDOM ACCESS MEMORY CIRCUIT IN LOW VOLTAGE OPERATION

(71) Applicant: STMicroelectronics International N.V., Schiphol (NL)

(72) Inventors: Ashish Kumar, Ranchi (IN); Vinay Kumar, Aligarh (IN); Kedar Janardan Dhori, Ghaziabad (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/909,261

(22) Filed: Mar. 1, 2018

(65) Prior Publication Data

US 2018/0190346 A1    Jul. 5, 2018

Related U.S. Application Data

(62) Division of application No. 15/447,853, filed on Mar. 2, 2017, now Pat. No. 9,940,997.

(60) Provisional application No. 62/330,613, filed on May 2, 2016.

(51) Int. Cl.
| | |
|---|---|
| *G11C 11/419* | (2006.01) |
| *G11C 11/418* | (2006.01) |
| *G11C 5/14* | (2006.01) |
| *G11C 5/06* | (2006.01) |

(52) U.S. Cl.
CPC .......... *G11C 11/419* (2013.01); *G11C 5/147* (2013.01); *G11C 11/418* (2013.01); *G11C 5/063* (2013.01); *G11C 5/145* (2013.01)

(58) Field of Classification Search
CPC ..... G11C 11/419; G11C 5/147; G11C 11/418; G11C 5/145
USPC ........................ 365/154, 189.09, 194, 230.06
See application file for complete search history.

(56) References Cited

U.S. PATENT DOCUMENTS

| | | | |
|---|---|---|---|
| 6,337,831 B1 * | 1/2002 | Nam | ........................ G11C 8/08 365/230.01 |
| 6,556,471 B2 | 4/2003 | Chappell et al. | |
| 6,791,886 B1 | 9/2004 | Bhavnagarwala et al. | |
| 8,300,451 B2 | 10/2012 | Mair et al. | |

(Continued)

OTHER PUBLICATIONS

Yabuuchi, Makoto et al: "A 45nm Low-Standby-Power Embedded SRAM with Improved Immunity Against Process and Temperature Variations," ISSCC 2007 / Session 18 / SRAM / 18.3, pp. 326, 327, 606.

*Primary Examiner* — David Lam
(74) *Attorney, Agent, or Firm* — Crowe & Dunlevy

(57) ABSTRACT

Read stability of a memory is enhanced in low voltage operation mode by selectively boosting a cell supply voltage for a row of memory cells. The boosted voltage results from a capacitive coupling to the word line in that row. The capacitive coupling is implemented by running the metal line of the power supply line for the cell supply voltage and the metal line for the word line adjacent to each other in a common metallization level. The selective voltage boost is controlled in response to operation of a modified memory cell exhibiting a deteriorated write margin. An output of the modified memory cell is compared to a threshold to generate a signal for controlling the selective voltage boost. Word line under-voltage circuitry is further provided to control application of an under-voltage to the word line.

10 Claims, 9 Drawing Sheets

(56) References Cited

U.S. PATENT DOCUMENTS

| | | |
|---|---|---|
| 8,432,764 B2 | 4/2013 | Heymann et al. |
| 2005/0068836 A1* | 3/2005 | Oh .......................... G11C 8/08 365/229 |
| 2012/0155194 A1* | 6/2012 | Chong ................. G11C 11/418 365/189.11 |

* cited by examiner

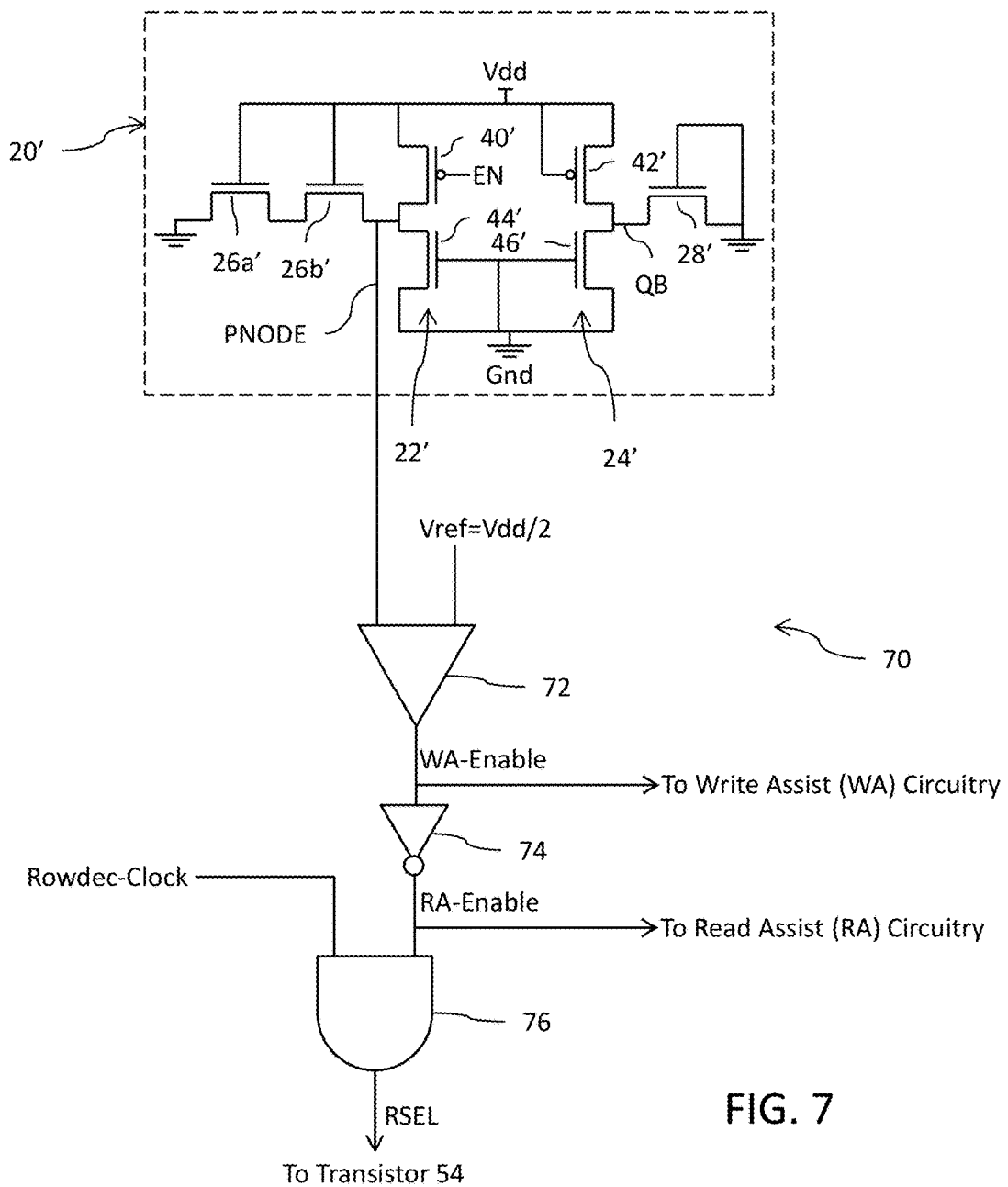

METHOD AND APPARATUS FOR ENHANCING READ STABILITY OF A STATIC RANDOM ACCESS MEMORY CIRCUIT IN LOW VOLTAGE OPERATION

CROSS REFERENCE TO RELATED APPLICATION

This application is a divisional of U.S. patent application Ser. No. 15/447,853, filed Mar. 2, 2017, which claims priority to U.S. Provisional Patent Application No. 62/330,613 filed May 2, 2016, the disclosures of which are incorporated by reference.

TECHNICAL FIELD

The present invention relates to an integrated memory circuit and in particular to a method and apparatus for enhancing read stability of a static random access memory (SRAM) circuit.

BACKGROUND

It is known in the art to operate an integrated memory circuit (such as an SRAM) at a plurality of supply voltages. For example, an integrated memory circuit may be supplied with a relatively high supply voltage (for example, 1.26V) in one mode of operation and further supplied with a relatively low supply voltage (for example, 0.6V) in another mode of operation. The static noise margin (SNM) of the SRAM, however, can significantly deteriorate in the relatively low supply voltage mode of operation. To address this problem, read assist (RA) circuits are connected to the SRAM to increase stability. A commonly used read assist circuit is connected to the word line (WL) to effectuate a technique referred to as word line under-drive (WLUD) which improves SNM by reducing pass gate transistor strength. A drawback of this technique is a timing penalty due to reduced read current.

Reference is now made to FIG. 1 showing a block diagram of an integrated memory circuit 10. The circuit 10 includes a memory array 14 formed by a plurality of rows and columns. Each column is defined by a pair of bit lines that are complementary and noted as bit line true BLT and bit line bar BLB, with a memory cell 20 coupled between the pair of bit lines BLT, BLB at each row location and driven by a corresponding word line WL. The word lines WL are driven by a row decoder circuit 26 which operates to decode an address ADD and select, based on the decoded address, one word line WL for actuation. A sense amplifier circuit 30 is coupled to the plurality of pairs of bit lines through a column multiplexing circuit 32. The sense amplifier circuit 30 includes a plurality of sense amplifiers 36. The column multiplexing circuit 32 is controlled by a column decoder circuit 40 to selectively connect bit line pairs to the sense amplifiers 36 of the sense amplifier circuit 30 in response to the decoded address ADD. The configuration and operation of column multiplexed memory circuits is well known to those skilled in the art.

Reference is made to FIG. 2 which shows a schematic diagram of the memory cell 20 implemented as a six transistor (6T) static random access memory (SRAM) cell. The cell 20 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QB. The cell 20 further includes two transfer (passgate) transistors 26 and 28 whose gate terminals are driven by a wordline (WL). Transistor 26 is source-drain connected between the true data storage node QT and a node associated with a true bitline (BLT). Transistor 28 is source-drain connected between the complement data storage node QB and a node associated with a complement bitline (BLB). The source terminals of the p-channel transistors 40 and 42 in each inverter 22 and 24 are coupled to receive a high supply voltage (for example, Vdd) at a high supply node, while the source terminals of the n-channel transistors 44 and 46 in each inverter 22 and 24 are coupled to receive a low supply voltage (for example, Gnd) at a low supply node. The high supply voltage Vdd at the high supply node and the low supply voltage Gnd at the low supply node comprise the power supply set of voltages for the cell 20. The wordline WL is coupled to the output of row decoder 26 (FIG. 1) and is driven by a wordline driver circuit (not shown) that typically comprises a series connected p-channel and n-channel MOSFET transistor pair forming a logic inverter. The wordline driver circuit is also coupled to receive the high supply voltage (Vdd) at the high supply node and is referenced to the low supply voltage (Gnd) at the low supply node.

SUMMARY

In an embodiment, a memory circuit comprises: a memory cell including a first metal line extending across the memory cell and configured to carry a word line signal and a second metal line extending across the memory cell and configured to carry a cell supply voltage; wherein the first and second metal lines extend immediately adjacent to each other in a same metallization level so that a capacitance is formed between the first and second metal lines; and a transistor having a source-drain path coupled between a source of a high supply voltage and said second metal line, said transistor having a control terminal configured to receive a control signal for deactivating the transistor to decouple the second metal line from the source of the high supply voltage when the word line signal is asserted to permit a boost of cell supply voltage on said second metal line to a level in excess of said high supply voltage in response to capacitive coupling between the first and second metal lines.

In an embodiment, a memory circuit comprises: a memory cell including a word line extending across the memory cell and configured to carry a word line signal and a high supply line extending across the memory cell and configured to carry a cell supply voltage; a transistor having a source-drain path coupled between a high supply voltage and said high supply line, said transistor having a control terminal configured to receive a control signal for deactuating the transistor to decouple the high supply voltage from the high supply line, the cell supply voltage being boosted in response to capacitive coupling with the word line; and a control circuit configured to generate said control signal, the control circuit including: a modified memory cell including transistors matching transistors of said memory cell and configured to operate with a deteriorated write margin relative to said memory cell, the modified memory cell having a output node generating an output signal; and a comparator circuit configured to compare the output signal to a reference voltage and generate a comparison result signal; wherein said control signal is derived from said comparison result signal.

In an embodiment, a memory circuit comprises: a memory cell including a word line extending across the memory cell and configured to carry a word line signal; a word line driver circuit configured to apply said word line signal to the word line; and a word line under-voltage circuit coupled to said word line and configured to apply an under-voltage to the word line, wherein said word line under-voltage circuit comprises: a first n-channel transistor having a source-drain path coupled between the word line and an intermediate node; a second n-channel transistor having a source-drain path coupled between the intermediate node and a reference supply voltage node; wherein gate terminals of the first and second n-channel transistors are coupled to receive the under-voltage control signal; and a p-channel transistor having a source-drain path coupled between the high supply voltage and the intermediate node, said p-channel transistor configured in an on state.

In an embodiment, a memory circuit comprises: a memory cell including a word line extending across the memory cell and configured to carry a word line signal; a word line driver circuit configured to apply said word line signal to the word line; and a word line under-voltage circuit coupled to said word line and configured to apply an under-voltage to the word line, wherein said word line under-voltage circuit is configured to delay application of the under-voltage to the word line such that a drive voltage on the word line is controlled by the word line driver circuit to a full voltage level during an initial period and after said initial period the word line under-voltage circuit controls application of an under voltage level which is less than said full voltage level to the word line.

In an embodiment, a memory circuit comprises: a memory cell including a word line extending across the memory cell and configured to carry a word line signal; a word line driver circuit configured to apply said word line signal to the word line; and a word line under-voltage circuit coupled to said word line and configured to delay application of the under-voltage to the word line such that a drive voltage on the word line is controlled by the word line driver circuit to a full voltage level during an initial period and after said initial period the word line under-voltage circuit controls application of a first under voltage level which is less than said full voltage level to the word line during a first under-voltage period and after said first under-voltage period the word line under-voltage circuit controls application of a second under voltage level which is less than said first under-voltage level to the word line during a second under-voltage period.

BRIEF DESCRIPTION OF THE DRAWINGS

For a better understanding of the embodiments, reference will now be made by way of example only to the accompanying figures in which:

FIG. 7 is a circuit diagram for an activation circuit.

DETAILED DESCRIPTION

Figure 3:
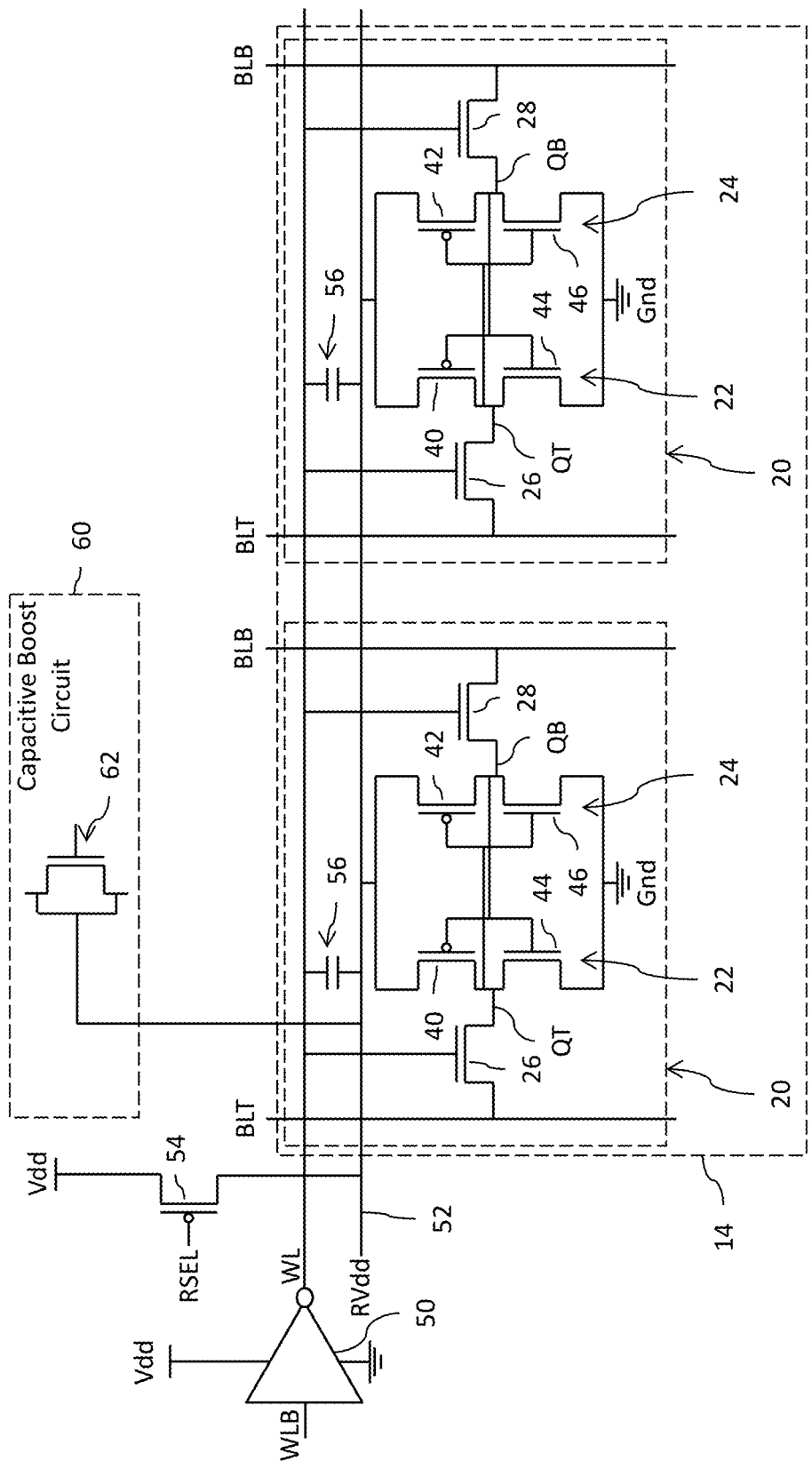
FIG. 3 is a schematic diagram of a supply voltage boost circuit.

Reference is now made to FIG. 3 showing a supply voltage boost circuit for the memory 14. In this illustration only two memory cells 20 in a single row of the memory 14 are shown. The memory cells 20 of the row share a common word line WL driven by a word line driver circuit 50 in response to a word line control signal (WLB) generated by the row decoder in response to decoding an address selecting the row. The memory cells 20 of the row further share a common high supply line 52. The voltage on the common high supply line 52 is referred to as a cell supply voltage (RVdd). The common high supply line 52 is coupled to receive the high supply voltage (Vdd) at, for example, 1.26V or 0.6V depending on operational mode. The common high supply line 52 is further coupled to a capacitive boost circuit 60 that is configured to assist in boosting the voltage on the common high supply line 52. The voltage boost may, for example, increase the RVdd voltage by 3-10% higher than the high supply voltage (Vdd). So, as an example, for a high supply voltage (Vdd) at 0.6V, a voltage boost of 50 mV may be provided to increase the RVdd voltage to 0.65V. The word line driver circuit 50 is further coupled to receive as a supply (source node) voltage the high supply voltage (Vdd). A p-channel MOSFET transistor 54 has its source-drain path coupled between a supply node for the high supply voltage (Vdd) and the common high supply line 52. The transistor 54 is selectively actuated by a control signal (RSEL) generated by a control circuit (reference 70, FIG. 7). When transistor 54 is actuated, the voltage RVdd is substantially equal to the high supply voltage Vdd. When the capacitive boost circuit 60 is actuated (and transistor 54 is not actuated so as to isolate the common high supply line 52 from the high supply voltage Vdd), the voltage RVdd is boosted by the capacitive boost circuit 60.

Figure 4:
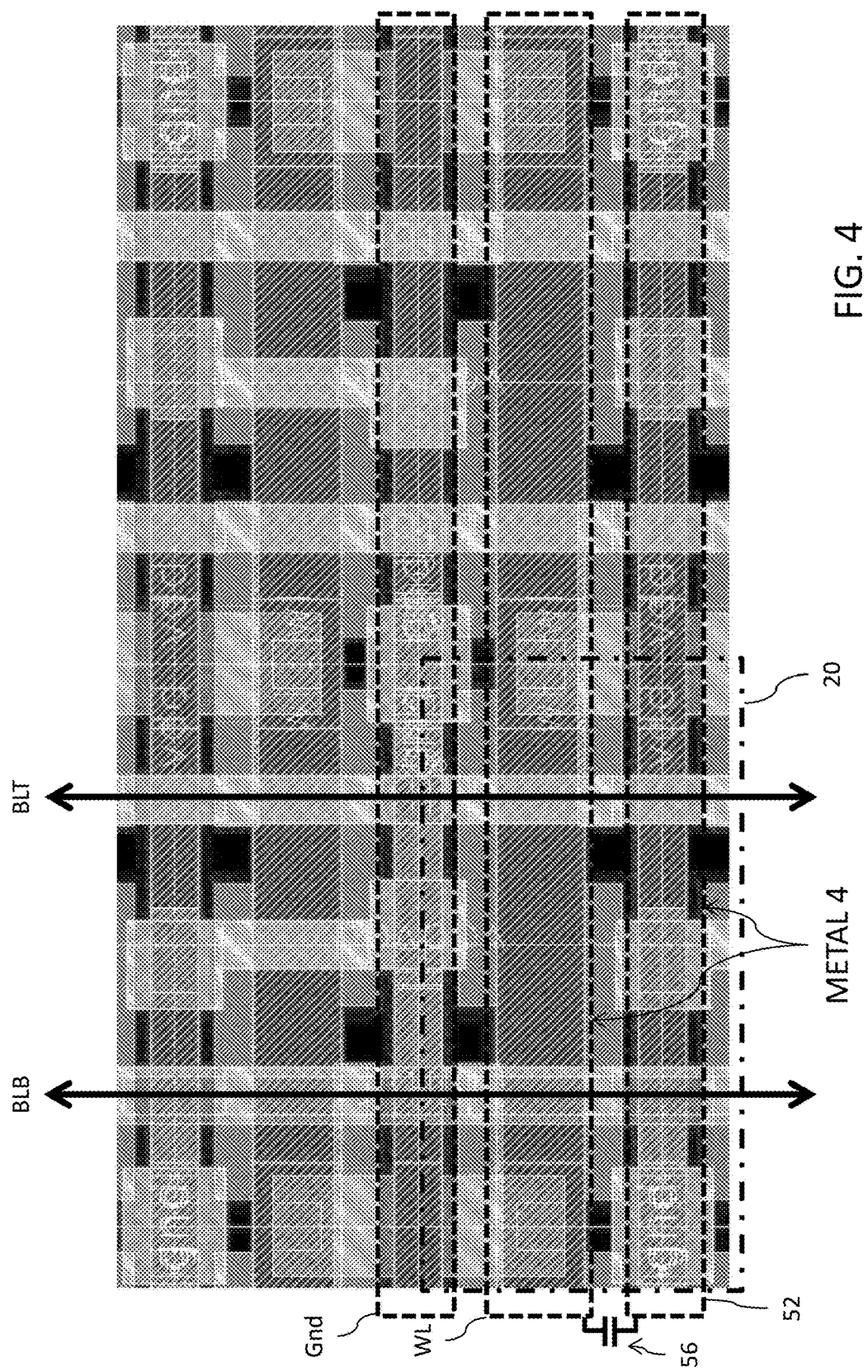
FIG. 4 is an integrated circuit layout specifically emphasizing a single metallization level including both the word line and the high supply line with a capacitive coupling.

The common word line WL and common high supply line 52 for the row are capacitively coupled to each other by a capacitance represented by the capacitors 56. The capacitance represented by the capacitors 56 is implemented by placing the metal line for the common word line WL and the metal line for the common high supply line 52 immediately adjacent to each other and extending in parallel to each other across the memory 14 in a same metallization layer of the integrated circuit for the memory 14. As an example, FIG. 4 shows a layout of the memory 14 for four cells 20 (two cells in each of two rows) and showing with respect to the fourth metallization level (M4) the metal line for the common word line WL and the metal line for the common high supply line 52. The metal line for the common low supply node (Gnd) also extends parallel and immediately adjacent to the common word line WL. The bit lines BLT, BLB extend perpendicular to the common high supply line 52, common word line WL and common low supply node, and are provided in a different metallization level (for example, in metal 2 or metal 3).

Figure 5:
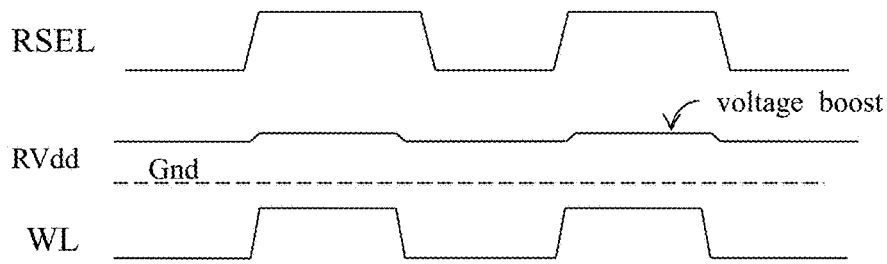
FIG. 5 illustrates operational waveforms for the supply voltage boost circuit.

Reference is now made to FIG. 5 illustrating operational waveforms for the supply voltage boost circuit of FIG. 3. Initially, the control signal (RSEL) is logic low and transistor 54 is turned on to apply the high supply voltage Vdd to the common high supply line 52. The control signal (RSEL) is then selectively asserted to deactuate transistor 54 and thus decouple the high supply voltage Vdd from the common high supply line 52 for the row of the memory coincident with a static noise margin (SNM) critical process, voltage, temperature (PVT) condition. When the word line (WL) is simultaneously actuated, the coupling between the word line and the common high supply line 52 and the boost capacitor 62 of the capacitive boost circuit 60 produces a voltage boost in the RVdd voltage on the common high supply line 52.

It will be noted that the rise in the supply voltage RVdd degrades write margin (WM) of the memory cell, with write margin being worst at the slow-fast (SF) process corner where the static noise margin is good. So, the rise in the supply voltage through word line coupling and in response to control over transistor 54 is not required at the write margin critical PVT condition. This is avoided to ensure correct write operation at the write margin critical PVT condition while ensuring the stability of the memory cell (SNM) across all PVT conditions.

The selective voltage boost of the RVdd voltage on the common high supply line 52 is an approach which helps avoid overhead for write assist (WA) design at the write critical PVT condition which otherwise would have been impacted due to the rise in supply voltage.

The selective voltage boost of the RVdd voltage on the common high supply line 52 for the row selected by the row decoder provides a number of operational advantages including: a) increasing the strength of the pull down transistors of the latch circuits which effectively lowers the voltage of the internal node storing the low logic value for the SRAM cell; b) increasing the switching threshold of the feedback inverter; c) reducing the relative strength of the pass transistor to provide for an increase in SNM; and d) improving speed of operation.

The voltage boost of the RVdd voltage is supported by the capacitive boost circuit 60 in addition to capacitive coupling between the word line and the common high supply line 52. The capacitive boost circuit 60 may utilize one or more n-channel MOSFET transistors connected as capacitors (reference 62). In this regard, it is noted that n-channel devices configured as capacitors offer higher capacitance at the fast-slow (FS) process corner condition which is the SNM critical condition in order to provide the voltage boost above the high supply voltage (Vdd). Conversely, such n-channel devices configured as capacitors offer lower capacitance at the slow-fast (SF) process corner condition in order to provide a slightly lower value for the voltage boost.

Figure 6A:
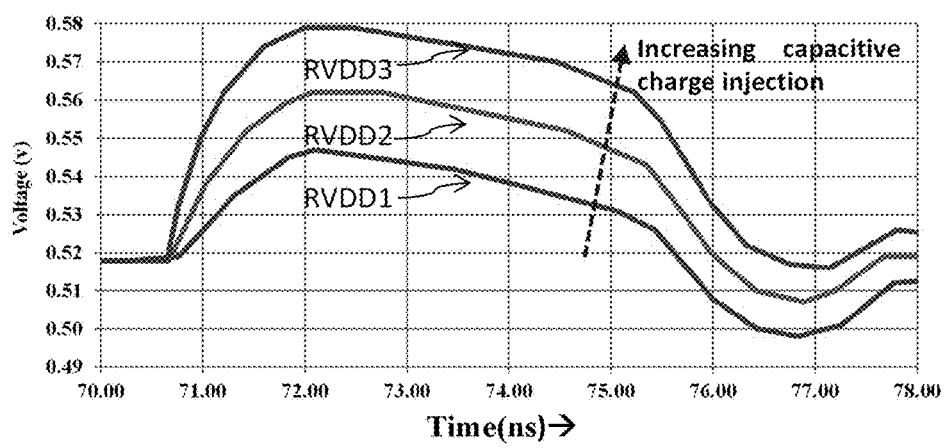
FIG. 6A shows application of a boosted high supply voltage.
Figure 6B:
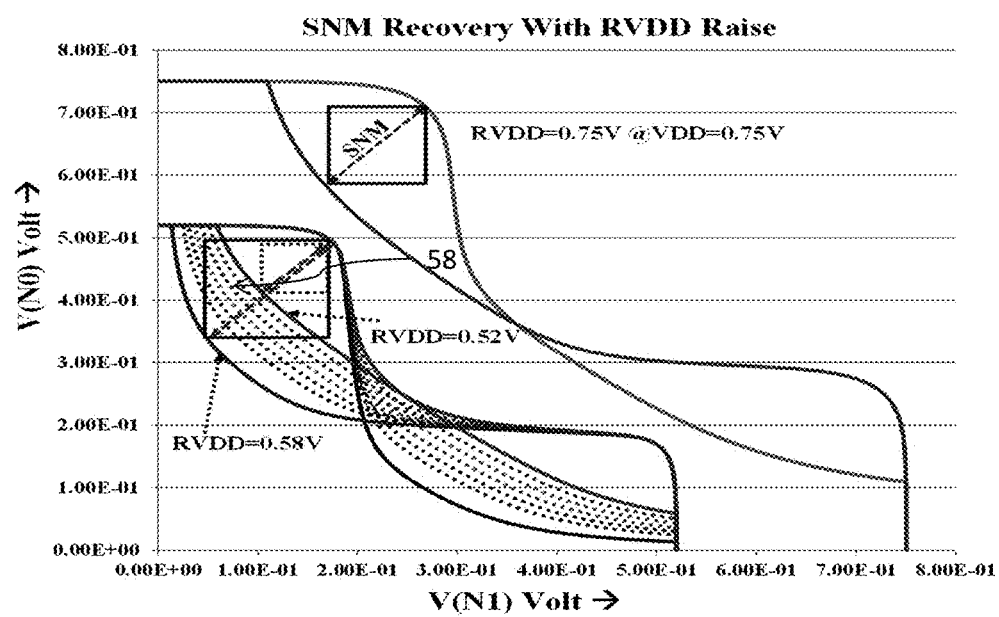
FIG. 6B is a butterfly curve illustrating improvement in static noise margin with boosted high supply voltage.

Reference is now made to FIG. 6A showing application of the voltage boost. In particular, FIG. 6A shows examples of three different voltage boost levels for the voltage RVdd on the common high supply line 52 (see, references RVDD1-RVDD3). The modulation of the voltage on the common high supply line 52 is achieved through additional capacitive charge injection. Following deactuation of transistor 54 in response to assertion of the control signal (RSEL), the common high supply line 52 is floating and the RVdd voltage on the common high supply line 52 will rise and then gradually drop due to leakage and bitline coupling. FIG. 6B is a butterfly curve showing the improvement in static noise margin 58 with use of a voltage boost level to 0.58V when the memory is operating in low voltage mode (i.e., with a nominal supply voltage of 0.52V). This corresponds to RVDD3=0.58V peak voltage boost of FIG. 6A.

Reference is now made to FIG. 7 showing a circuit diagram for an activation circuit 70 to generate the control signal (RSEL) for selective decoupling of the high supply voltage Vdd from the common high supply line 52 in order to permit voltage boost of the RVdd voltage. The activation circuit 70 includes a modified memory cell 20' including first and second CMOS inverters 22' and 24', each inverter including a series connected p-channel and n-channel MOSFET transistor pair. Unlike the memory cell 20 of FIG. 2, however, the inverters 22' and 24' in modified memory cell 20' are not cross-coupled. The source terminals of the p-channel transistors 40' and 42' in each inverter 22' and 24' are coupled to receive the high supply voltage (Vdd) at a high supply node, while the source terminals of the n-channel transistors 44' and 46' in each inverter 22' and 24' are coupled to receive a low supply voltage (for example, Gnd) at a low supply node. The gate terminal of the p-channel transistor 40' in inverter 22' is coupled to receive an enable signal (EN). The gate terminal of the p-channel transistor 42' in inverter 24' is coupled to the high supply node and thus is configured to be turned off. The gate terminals of the n-channel transistors 44' and 46' are coupled to the low supply node and thus are configured to be turned off. The modified memory cell 20' further includes two transfer (passgate) transistors 26a' and 26b' connected between the coupled drain terminals of the transistors 40' and 44' of inverter 22' (PNODE) and the low supply node. The modified memory cell 20' further includes a transfer (passgate) transistor 28' connected between the coupled drain terminals of the transistors 42' and 46' of inverter 24' and the low supply node. The gate terminals of the passgate transistors 26a' and 26b' are coupled to high supply node (thus configured to be turned on) and the gate terminal of the passgate transistor 28' is coupled to the low supply node (thus configured to be turned off).

The transistors 26a'/26b', 40', 42', 44' and 46' are replicas of the transistors 26, 40, 42, 44 and 46, respectively. By "replicas" it is meant that the corresponding transistors are matching (for example, they have the same gate widths, lengths, W/L ratios, oxide thicknesses, doping concentrations, etc.) even if not electrically connected in the same way. Indeed, the same integrated circuit layout may be used for both cell 20 and cell 20' except for changes in the relative wiring interconnections.

Figure 1:
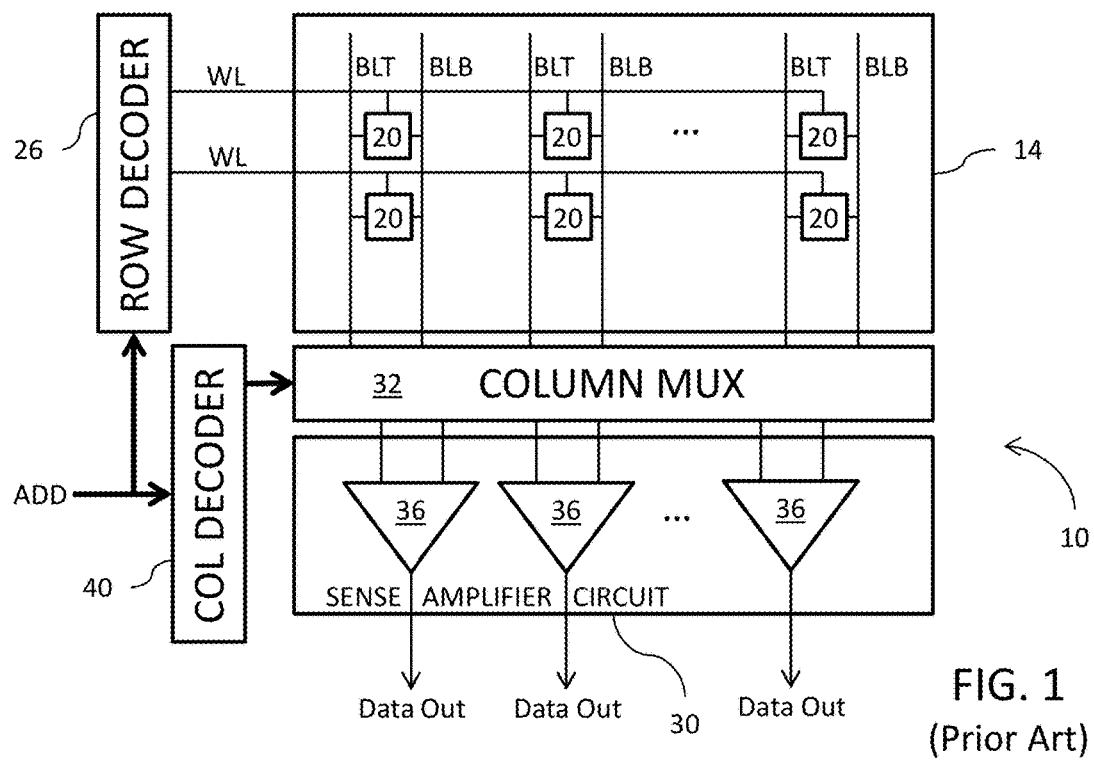
FIG. 1 is a block diagram of an integrated memory circuit.
Figure 2:
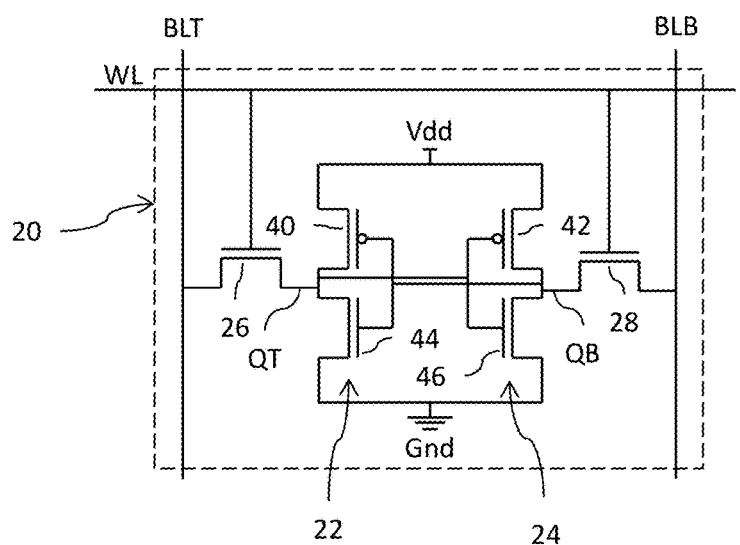
FIG. 2 is a schematic diagram of a memory cell.

The additional passgate transistor 26b' in the modified memory cell 20' produces a deterioration of the write margin (WM) of the modified memory cell 20' in comparison to memory cell 20 of FIG. 2.

Figure 8:
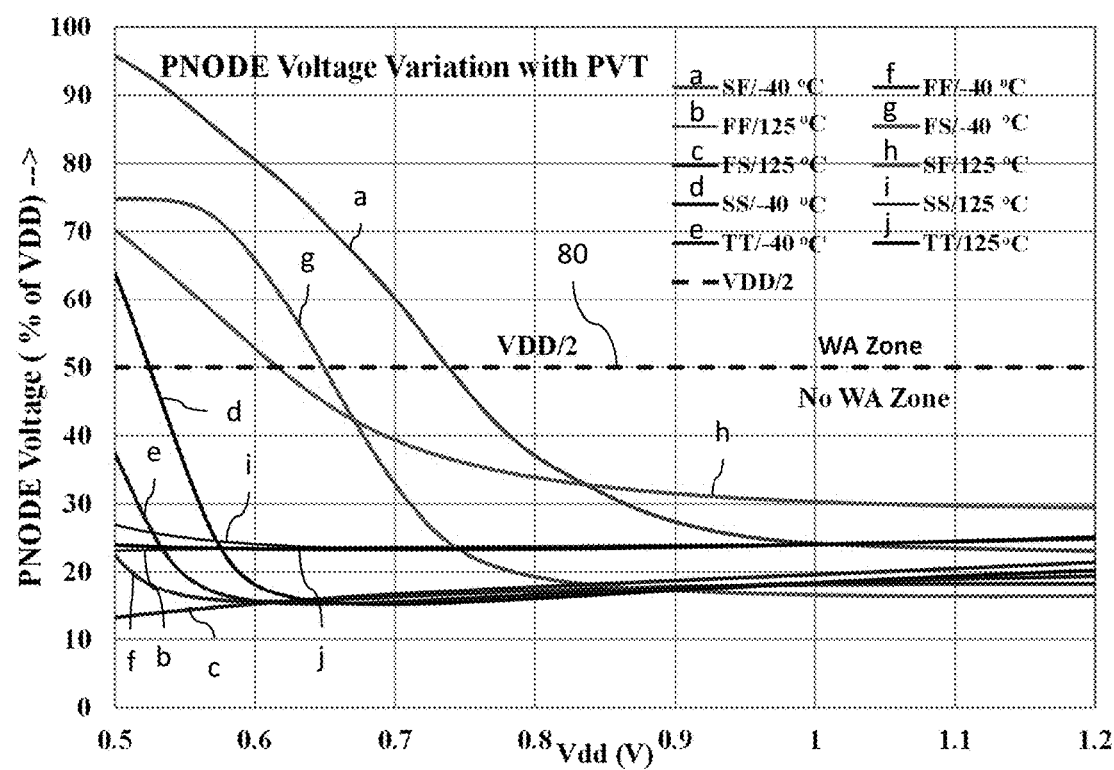
FIG. 8 shows PNODE voltage variation with variation in process, voltage, temperature.

When the enable signal (EN) is asserted to turn on transistor 40', a voltage is developed at PNODE. FIG. 8 shows PNODE voltage variation with variation in process, voltage, temperature (PVT) in relation slow-fast (SF), fast-fast (FF), fast-slow (FS), slow-slow (SS) and typical-typical (TT) process corners.

The PNODE voltage is monitored by the circuit 70 and used to control whether write assist (WA) is activated. When the PNODE voltage is above a threshold line 80, it is desired to operate the memory cell 20 with write assist (WA) (referred to as the write assist (WA) zone). Conversely, when the PNODE voltage is below the threshold line 80, there is no need to use write assist (referred to as the no WA zone).

Correspondingly, the PNODE voltage is further monitored by the circuit and used to control whether read assist (RA) is activated. In this context, if the PNODE voltage is above the threshold line 80, there is no need to use read assist (RA) for the memory cells 20 in the selected row. Conversely, when the PNODE voltage is below the threshold line 80, it is desired to operate the memory cell 20 with read assist (RA).

The circuit 70 includes a comparator 72 (for example, a sense amplifier) having a first input coupled to receive the PNODE voltage and a second input coupled to receive a reference voltage Vref. In an embodiment, the reference voltage Vref corresponds to the threshold line 80. In a specific implementation, Vref=Vdd/2. The comparator 72 operates to compare the PNODE voltage to the reference voltage Vref and generate a signal WA-Enable in response to that comparison. The WA-Enable signal is applied to the memory to control actuation of any write assist (WA) circuitry. When the PNODE voltage exceeds the reference voltage Vref, the WA-Enable signal is asserted to turn on the write assist circuitry. Conversely, when the PNODE voltage is less than the reference voltage Vref, the WA-Enable signal is deasserted to turn off the write assist circuitry.

The circuit 70 further includes a logic inverter circuit 74 having an input coupled to the output of the comparator 72. The inverted circuit 74 operates to logically invert the WA-Enable signal and generate a signal RA-Enable. The RA-Enable signal is applied to the memory to control actuation of any read assist (RA) circuitry. When the PNODE voltage exceeds the reference voltage Vref, the RA-Enable signal is deasserted to turn off the read assist circuitry. Conversely, when the PNODE voltage is less than the reference voltage Vref, the RA-Enable signal is asserted to turn on the read assist circuitry.

The circuit 70 still further includes a logic AND gate 76 having a first input coupled to receive the RA-Enable signal and a second input coupled to receive a clock signal. The clock signal is preferably a clock (Rowdec-Clock) related to the operation of the row decoder in connection with decoding the received address and selecting one row of the memory by asserting the word line (WL). The logic AND gate 76 operates as a pass gate to pass the asserted RA-Enable signal when the Rowdec-Clock signal is logic high. The passed RA-Enable signal is output from the logic AND gate as the control signal (RSEL) for controlling the selective decoupling of the high supply voltage (Vdd) from the common high supply line 52.

Thus, read assist is disabled when the memory cell has a poor write margin but a good static noise margin. At the same time write assist is enabled. Hence, in such write-worst conditions, the control signal (RSEL) is not asserted and there is no application of a voltage boosted to the common high supply line 52. Such a voltage boost is not needed. Deterioration of write margin is thus avoided.

Figure 9:
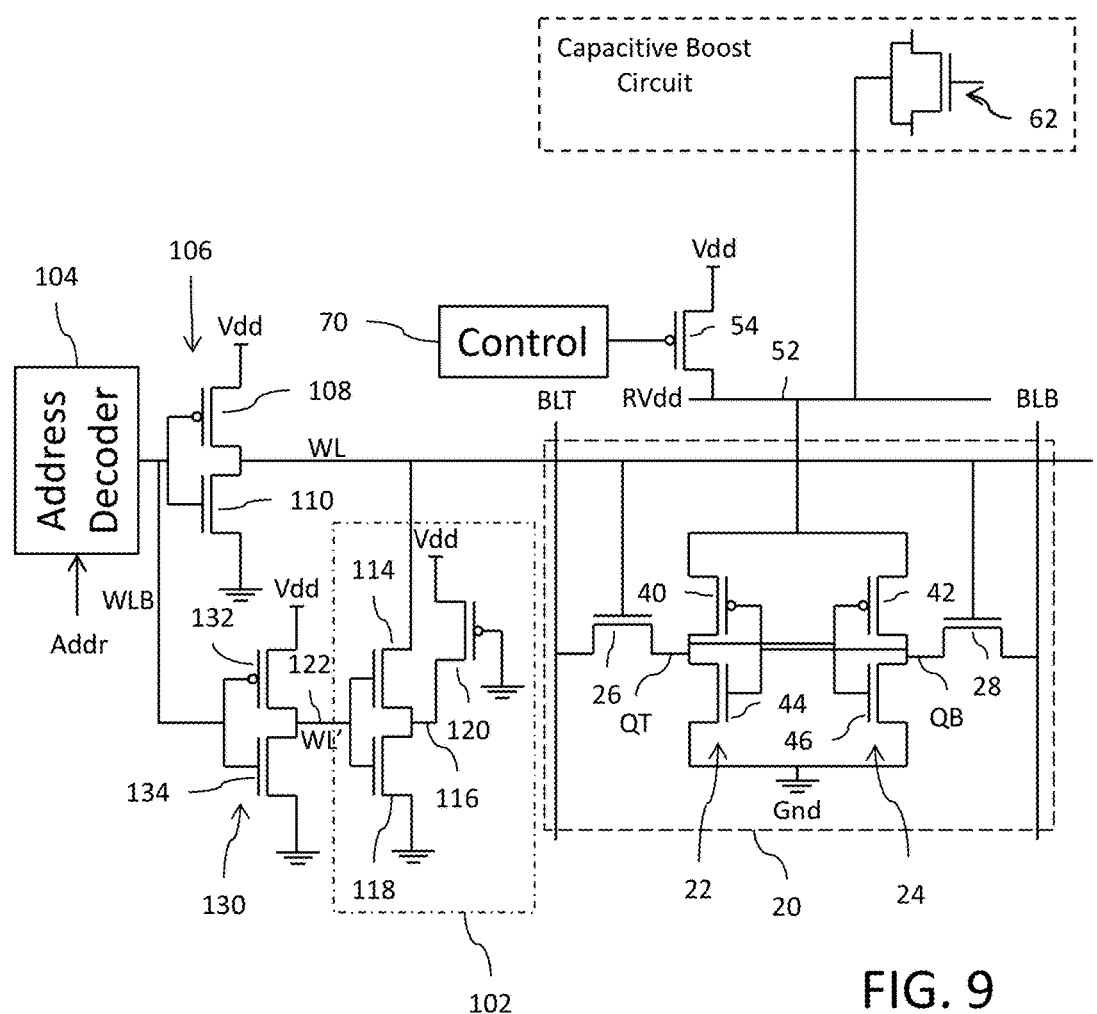
FIG. 9 is a schematic diagram of a memory circuit with word line under-drive functionality in addition to the boosted supply voltage functionality.

Reference is now made to FIG. 9 which shows a schematic diagram of a memory circuit with word line under-drive functionality in addition to the boosted supply voltage functionality described above. Like reference numbers refer to like or similar components described above and which will not be further described.

The memory circuit includes an under-drive circuit 102. The row decoder includes an address decoder 104 and a word line driver 106. The address decoder 104 decodes the received address (Addr) to generate a word line control signal (WLB). The word line driver 106 receives the word line control signal and generates the word line signal (WL). The word line driver 106 includes a p-channel transistor 108 source-drain connected between the high supply node and the word line and an n-channel transistor 110 source-drain connected between the word line and the low supply node.

The under-drive circuit 102 includes a first n-channel transistor 114 source-drain connected between the word line WL and an intermediate node 116 and a second n-channel transistor 118 source-drain connected between the intermediate node 116 and the low supply node. The under-drive circuit 102 further includes a p-channel transistor 120 source-drain connected between the high supply node and the intermediate node 116. An input node 122 of the read assist circuit 102 is connected to the gate terminals of the first and second n-channel transistors 114 and 118. The gate terminal of the p-channel transistor 120 is connected to the low supply node. A logic inverter circuit 130 receives the word line control signal (WLB) and generates an under-drive control signal (WL') that is coupled to the input node 122 of the read assist circuit 102. The logic inverter 130 includes a p-channel transistor 132 source-drain connected between the high supply node and the input node 122 and an n-channel transistor 134 source-drain connected between the input node 122 and the low supply node.

The logic inverter circuit 130 applies a same logic state signal to the input node 122 of the under-drive circuit 102 as the word line driver 106 applies to the word line (WL). When the word line is asserted this is a logic high signal and so the under-drive control signal (WL') is likewise a logic high signal. This turns on the first and second n-channel transistors 114 and 118. Because the gate terminal of the p-channel transistor 120 in connected to the low supply node, the p-channel transistor 120 is also turned on. A current is thus sunk by the under-drive circuit 102 from the word line (WL). A word line under-drive operation is accordingly performed. Conversely, when the word line is deasserted (a logic low signal) the under-drive control signal (WL') is likewise a logic low signal. This will turn off the first and second n-channel transistors 114 and 118.

The total current passing through the second n-channel transistor 118 is equal to the sum of the currents passing through the first n-channel transistor 114 and the p-channel transistor 120. The word line under-drive operation is compensated through the operation of the p-channel transistor 120. At static noise margin critical PVT, word line under-drive is provided and substantial current flows through both the first n-channel transistor 114 and the p-channel transistor 120. However, at write margin (WR) critical PVT or speed critical PVT, there is effectively no word line under-drive as substantially all current flows through the p-channel transistor 120 and little to no current flows through the first n-channel transistor 114.

In connection with this word line under-drive operation, the control circuit 70 operates as described above to control actuation of the transistor 54 for selective decoupling of the high supply voltage (Vdd) from the common high supply line 52. In an embodiment, an overall read assist (RA) functionality involves the application of the voltage boost of the RVdd voltage during read operation with the word line under-drive used during write operation. The application of the voltage boost during read operation provides for an increase in the static noise margin along with a read performance boost. The word line under-drive provides zero overhead on write assist while ensuring stability of the half-selected memory cells (i.e., those cells 20 in the selected row but not in a selected column of that row). Conventional write assist circuitry (not shown, but well known to those skilled in the art) is used to ensure a correct write operation.

Figure 10:
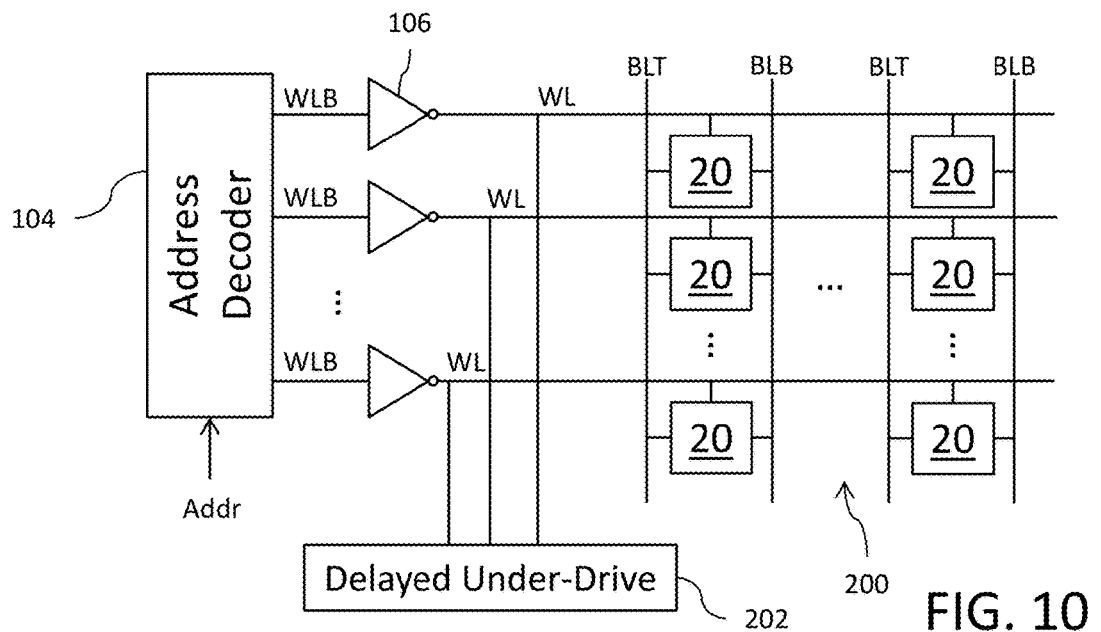
FIG. 10 illustrates the implementation of a read assist function for a memory array.

Reference is now made to FIG. 10 showing the implementation of a delayed under-drive function for a memory array 200. The memory array 200 includes a plurality of memory cells 20 arranged in rows and columns. A wordline WL is provided for each row and is connected to the passgate transistors of the cells 20 in that row. A delayed under-drive circuit 202 is connected to each wordline WL of the memory array 200.

Figure 11:
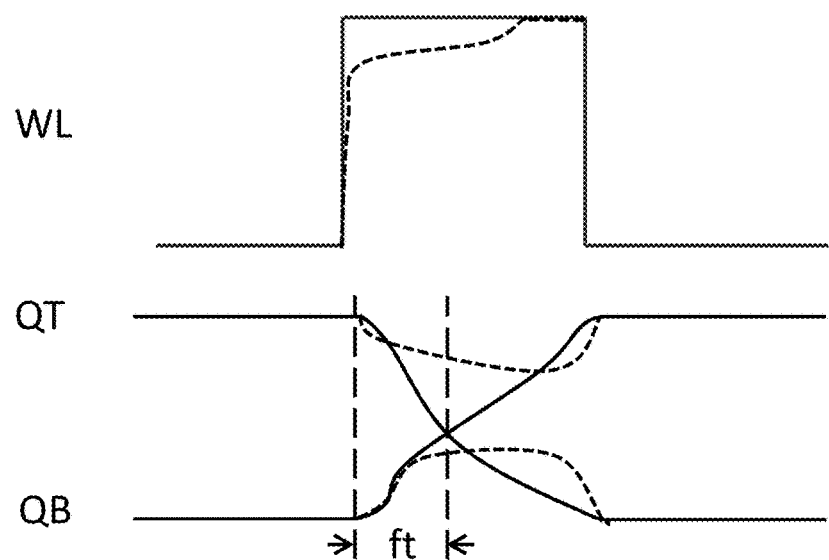
FIGS. 11-13 show operational waveforms for word line under-drive.

FIG. 11 illustrates the timing of a conventional word line under-drive operation. With respect to the word line (WL) signal, the solid line indicates the waveform shape of the drive voltage for the word line by the word line driver in the absence of an under-drive. With respect to the signals at the QT and QB nodes of the memory cell 20, the solid line indicates an operation where the logic state stored in the memory flips in error under the operating condition of a low static noise margin (SNM). The use of the word line under-drive operation can prevent this erroneous flip in logic state from occurring. With respect to the word line (WL) signal, the dotted line indicates the waveform shape with the application of an under-drive. At the beginning of the read operation, the under-drive circuit controls application of a reduced voltage (less than the drive voltage) to the word line for a time period that is in excess of the logic state flipping time (ft). With respect to the signals at the QT and QB nodes of the memory cell 20, the dotted line indicates the effect of the under-drive to prevent the erroneous flip in logic state from occurring.

The delayed under-drive circuit 202 operates to apply a delayed under-drive operation. The flipping time (ft) of the cell can be measured and saved in the delayed under-drive circuit 202 for the purpose of informing and controlling the delayed under-drive operation.

Figure 12:
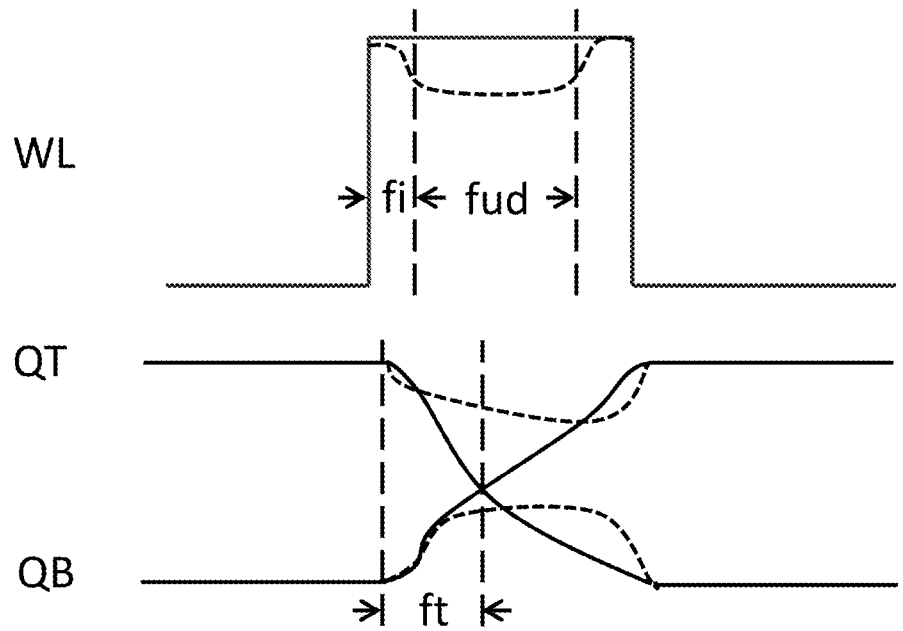

FIG. 12 illustrates the timing of a first implementation of the delayed word line under-drive operation. With respect to the word line (WL) signal, the solid line indicates the waveform shape of the drive voltage for the word line by the word line driver in the absence of an under-drive. With respect to the signals at the QT and QB nodes of the memory cell 20, the solid line indicates an operation where the logic state stored in the memory flips in error under the operating condition of a low static noise margin (SNM). The use of the delayed word line under-drive operation can prevent this erroneous flip in logic state from occurring. With respect to the word line (WL) signal, the dotted line indicates the waveform shape of the word line drive voltage with the application of the first implementation for the delayed under-drive. At the beginning of the read operation, the word line (WL) signal has a drive voltage at the full voltage level (corresponding to the operation in absence of any under-drive) in response to the driver 106 actuation. This initial full voltage level signal state for the word line lasts for an initial time period (fi) that is less than the logic state flipping time (ft). In an embodiment, the initial time period (fi) may, for example, be 20-40% of the flipping time (ft). After expiration of the initial time period (fi), the under-drive circuit 202 controls application of a reduced voltage to the word line for a time period (fud) that expires substantially after the end of the logic state flipping time (ft). With respect to the signals at the QT and QB nodes of the memory cell 20, the dotted line indicates the effect of the under-drive to prevent the erroneous flip in logic state from occurring. The initial full voltage level of the word line signal helps for faster operation with the delayed under-drive ensuring that there is not erroneous flip in logic state under the operating condition of a low static noise margin (SNM).

Figure 13:
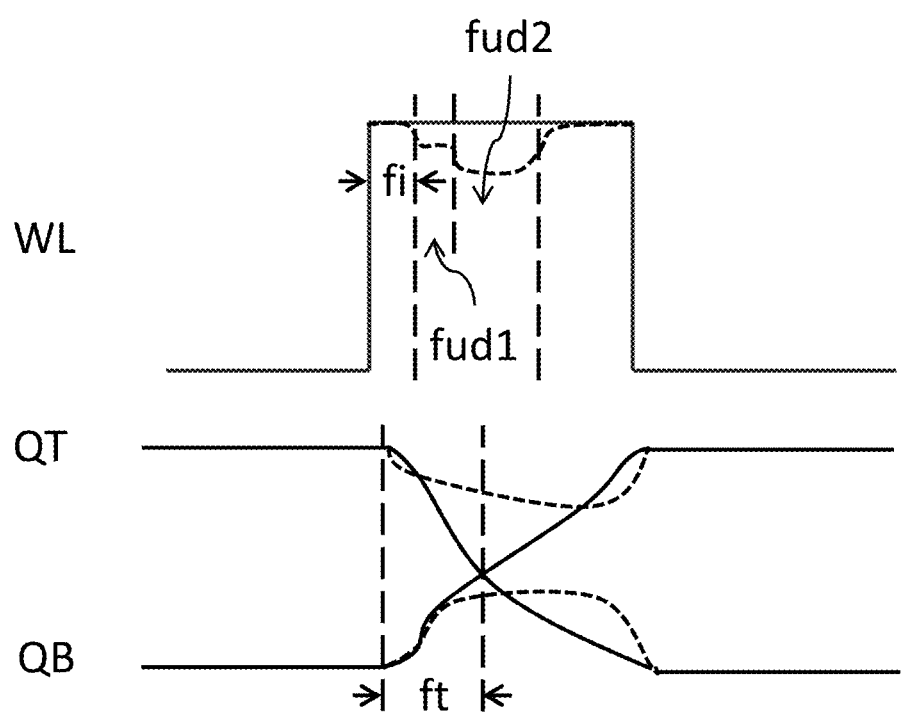

FIG. 13 illustrates the timing of a second implementation of the delayed word line under-drive operation. With respect to the word line (WL) signal, the solid line indicates the waveform shape of the drive voltage for the word line by the word line driver in the absence of an under-drive. With respect to the signals at the QT and QB nodes of the memory cell 20, the solid line indicates an operation where the logic state stored in the memory flips in error under the operating condition of a low static noise margin (SNM). The use of the delayed word line under-drive operation can prevent this erroneous flip in logic state from occurring. With respect to the word line (WL) signal, the dotted line indicates the waveform shape of the word line drive voltage with the application of the first implementation for the delayed under-drive. At the beginning of the read operation, the word line (WL) signal has a drive voltage at the full voltage level (corresponding to the operation in absence of any under-drive) in response to the driver 106 actuation. This initial full voltage level signal state for the word line lasts for an initial time period (fi) that is less than the logic state flipping time (ft). In an embodiment, the initial time period (fi) may, for example, be 20-40% of the flipping time (ft). After expiration of the initial time period (fi), the under-drive circuit 202 controls application of a first reduced voltage to the word line for a time period (fud1) that expires prior to the end of the logic state flipping time (ft). After expiration of the time period (fud1), the under-drive circuit 202 controls application of a second reduced voltage (less than the first reduced voltage) to the word line for a time period (fud2) that expires substantially after the end of the logic state flipping time (ft). With respect to the signals at the QT and QB nodes of the memory cell 20, the dotted line indicates the effect of the under-drive to prevent the erroneous flip in logic state from occurring. The initial full voltage level of the word line signal helps for faster operation with the delayed under-drive ensuring that there is not erroneous flip in logic state under the operating condition of a low static noise margin (SNM).

In either FIG. 12 or FIG. 13, the under-drive circuit 202 operation to control the word line voltage in under-drive may be effectuated in any of a number of ways known to those skilled in the art. One implementation for the under-drive circuit utilizes selectively actuated current sinking functionality. Another implementation for the under-drive circuit utilizes selectively actuated resistive voltage division operations to control the under-drive voltage level.

Although not explicitly shown, it will be understood that the circuit of FIG. 10 may further include the circuitry (references 54 and 70, for example) for selective application of the voltage boost.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A memory circuit, comprising:
a memory cell including a word line extending across the memory cell and configured to carry a word line signal;
a word line driver circuit configured to apply said word line signal to the word line; and
a word line under-voltage circuit coupled to said word line and configured to apply an under-voltage to the word line, wherein said word line under-voltage circuit comprises:

a first n-channel transistor having a first source-drain path;

a second n-channel transistor having a second source-drain path;

wherein the first and second source-drain paths are connected at an intermediate node and coupled in series between the word line and a reference supply voltage node;

wherein gate terminals of the first and second n-channel transistors are coupled to receive an under-voltage control signal; and a p-channel transistor having a source-drain path coupled between a high supply voltage and the intermediate node, wherein a gate of said p-channel transistor is coupled to the reference supply voltage node and configured in an on state.

2. The memory circuit of claim 1, wherein the word line under-voltage circuit is configured to delay application of the under-voltage to the word line such that a drive voltage on the word line is controlled by the word line driver circuit to a full voltage level during an initial period and after said initial period the word line under-voltage circuit controls the drive voltage to an under voltage level which is less than said full voltage level.

3. The memory circuit of claim 2, wherein the initial period expires prior to a logic state flipping time of the memory cell and the control of the drive voltage to the under voltage level expires after the logic state flipping time.

4. The memory circuit of claim 1, wherein the word line under-voltage circuit is configured to delay application of the under-voltage to the word line such that a drive voltage on the word line is controlled by the word line driver circuit to a full voltage level during an initial period and after said initial period the word line under-voltage circuit controls the drive voltage to a first under voltage level which is less than said full voltage level during a first under-voltage period and after said first under-voltage period the word line under-voltage circuit controls the drive voltage to a second under voltage level which is less than said first under-voltage level during a second under-voltage period.

5. The memory circuit of claim 4, wherein the initial period expires prior to a logic state flipping time of the memory cell, wherein the first under-voltage period expires prior to a logic state flipping time of the memory cell and the second under-voltage period expires after the logic state flipping time.

6. A memory circuit, comprising:

a memory cell including a word line extending across the memory cell and configured to carry a word line signal that drives gate terminals of pass gate transistors of the memory cell;

a word line driver circuit configured to apply said word line signal to the word line; and a word line under-voltage circuit coupled to said word line and configured to apply an under-voltage to the word line, wherein said word line under-voltage circuit is configured to delay application of the under-voltage to the word line such that a drive voltage of the word line signal is controlled by the word line driver circuit to a full voltage level during an initial period and after said initial period the word line under-voltage circuit controls the drive voltage to an under voltage level which is less than said full voltage level and greater than a ground voltage.

7. The memory circuit of claim 6, wherein the initial period expires prior to a logic state flipping time of the memory cell and the control of the drive voltage to the under voltage level expires after the logic state flipping time.

8. A memory circuit, comprising:

a memory cell including a word line extending across the memory cell and configured to carry a word line signal that drives gate terminals of pass gate transistors of the memory cell;

a word line driver circuit configured to apply said word line signal to the word line; and a word line under-voltage circuit coupled to said word line and configured to apply an under-voltage to the word line, wherein said word line under-voltage circuit is configured to delay application of the under-voltage to the word line such that a drive voltage of the word line signal is controlled by the word line driver circuit to a full voltage level during an initial period and after said initial period the word line under-voltage circuit controls the drive voltage to a first under voltage level which is less than said full voltage level and greater than a ground voltage during a first under-voltage period and after said first under-voltage period the word line under-voltage circuit controls the drive voltage to a second under voltage level which is less than said first under-voltage level and greater than a ground voltage during a second under-voltage period.

9. The memory circuit of claim 8, wherein the initial period expires prior to a logic state flipping time of the memory cell, wherein the first under-voltage period expires prior to a logic state flipping time of the memory cell and the second under-voltage period expires after the logic state flipping time.

10. A memory circuit, comprising:

a memory cell including a word line extending across the memory cell and configured to carry a word line signal;

a word line driver circuit configured to apply said word line signal to the word line; and a word line under-voltage circuit coupled to said word line and configured to apply an under-voltage to the word line, wherein said word line under-voltage circuit comprises:

a first n-channel transistor having a source connected to the word line, a drain connected to an intermediate node and a gate;

a second n-channel transistor having a source connected to the intermediate node, a drain connected to a reference supply node, and a gate;

wherein the gates of the first and second n-channel transistors are coupled to receive an under-voltage control signal; and a p-channel transistor having a source connected to a high supply voltage, a drain connected to the intermediate node and a gate connected to the reference supply voltage node.

\* \* \* \* \*